United States Patent [19]

Dornfest et al.

[11] Patent Number: 5,779,807
[45] Date of Patent: Jul. 14, 1998

[54] METHOD AND APPARATUS FOR REMOVING PARTICULATES FROM SEMICONDUCTOR SUBSTRATES IN PLASMA PROCESSING CHAMBERS

[75] Inventors: Charles Dornfest, Fremont; Anand Gupta, San Jose; Gerald Girard, Milpitas, all of Calif.

[73] Assignee: Applied Materials, Inc., Santa Clara, Calif.

[21] Appl. No.: 740,407

[22] Filed: Oct. 29, 1996

[51] Int. Cl.[6] .................................. B08B 3/12; B44C 1/22
[52] U.S. Cl. .............................. 134/1.2; 216/67; 216/71
[58] Field of Search ........................... 134/1.2; 216/67, 216/71

[56] References Cited

U.S. PATENT DOCUMENTS

| | | | |
|---|---|---|---|
| 4,438,315 | 3/1984 | Toyoda et al. | 156/646 |
| 4,585,516 | 4/1986 | Corn et al. | 156/643 |
| 4,889,588 | 12/1989 | Fior | 156/643 |
| 5,328,555 | 7/1994 | Gupta | 156/643 |
| 5,376,211 | 12/1994 | Harada et al. | 156/643 |
| 5,410,122 | 4/1995 | Su et al. | 219/121.44 |
| 5,531,834 | 7/1996 | Ishizuka et al. | 156/345 |
| 5,573,597 | 11/1996 | Lantsman | 156/643.1 |
| 5,614,060 | 3/1997 | Hanawa | 156/643.1 |

*Primary Examiner*—Robert Kunemund
*Assistant Examiner*—George Goudreau
*Attorney, Agent, or Firm*—Noel F. Heal; Shirley L. Church

[57] ABSTRACT

An electrostatic technique for removing particulate matter from a semiconductor wafer in a plasma processing chamber, such as a plasma-enhanced chemical vapor deposition (PECVD) chamber. During a particulate removal phase of operation, a normally grounded electrode that supports the wafer is temporarily isolated from ground and a bias voltage generator is simultaneously connected to the electrode, supplying sufficient bias voltage to electrostatically launch particulates from the surface of the wafer. A plasma formed above the normally grounded electrode is maintained during the particulate removal phase, and particulates launched from the wafer become suspended in a sheath region surrounding the plasma, from where they can be later removed by a purging flow of gas. Preferably, the bias voltage generator provides a bias voltage that alternates in polarity, to ensure removal of both positively-charged and negatively charged particles from the wafer surface.

5 Claims, 1 Drawing Sheet

METHOD AND APPARATUS FOR REMOVING PARTICULATES FROM SEMICONDUCTOR SUBSTRATES IN PLASMA PROCESSING CHAMBERS

BACKGROUND OF THE INVENTION

This invention relates generally to plasma processing in the fabrication of semiconductor devices and, more particularly, to techniques for removing particulate matter from semiconductor substrates in plasma processing chambers, such as plasma enhanced chemical vapor deposition (PECVD), reactive ion etch (RIE) or sputter etch processing chambers. As is well known, semiconductor device geometries have been steadily shrinking in scale, and key features of devices have become more densely packed in each integrated circuit. When dealing with structural features at a microscopic level, engineers throughout the integrated circuit industry have had to deal with a critical problem of particulate control. Simply stated, the presence of particulates on integrated circuit substrates causes defects in some of the circuits. In most integrated circuit fabrication, many identical integrated circuits are formed on a single wafer, using a step-and-repeat lithographical process. The percentage of properly functioning integrated circuits formed on a wafer is referred to as the yield. Higher concentrations of particulates result in lower production yields. The problem is further compounded in the fabrication of extremely large, "wafer scale" integrated circuits, where significant particulate contamination can render an entire wafer useless.

It is generally agreed that the major source of particulates is the processing equipment itself, but there are no commercially available methods for removing particulates from wafers after their entry into a processing chamber. Because the present invention uses electrostatic forces to remove particulates from a processing chamber, it should be noted that the use of electrostatic energy to exert forces on particles has been known for many years, and was first demonstrated by Miliken in historic work discovering and quantifying the charge of the electron. Miliken's particles were small oil droplets, which he demonstrated could be moved up or down by the application of electrostatic fields.

A well known phenomenon in plasma etch reactors is the generation of a direct current (dc) bias between the plasma and a lower electrode to which rf power is applied. The dc bias accelerates positive ions in the reactor chamber toward the lower electrode, to which a semiconductor wafer is secured for etching. The energy of the ions accelerated from the plasma is one of the most important factors that determine the rate at which etching of the wafer takes place. As a result of the dc bias phenomenon, plasma etch processors already have a built-in technique for launching particulates electrostatically from the wafer surface. However, when there is no dc bias, as in PECVD processes, any particulates on the wafer surface are not automatically removed. Simply applying a permanent dc bias to the wafer does not work because the plasma tends to react in a way that compensates for the bias. Mobile charges in the plasma move to a position that shields out the effect of the biased surface.

It will be appreciated that there is an increasing need for particulate removal in semiconductor plasma processing chambers, such as PECVD chambers. The present invention fulfills this need.

SUMMARY OF THE INVENTION

The present invention resides in apparatus, and a method for its operation, for removing particulates electrostatically from a semiconductor wafer in a plasma processing chamber. In terms of a method, the invention comprises the steps of applying high-frequency plasma power across a two electrodes, one of which is normally grounded and supports a semiconductor wafer to be processed, whereby the plasma power initiates and maintains a plasma between the electrodes; then, at selected times, electrically isolating the wafer-supporting electrode and simultaneously applying to it a bias voltage selected to launch particulates from the surface of the wafer by electrostatic action; and maintaining the plasma during the selected times for launching the particulates. Launched particulates are suspended in the plasma until they can be later removed by purging with inert gas.

Preferably, the step of applying a bias voltage includes applying an alternating voltage, whereby both positively charged and negatively charged particulates will be launched from semiconductor wafer. The alternating bias voltage is selected to be in the same range as plasma potentials, such as approximately 100 v to 2,000 v. More specifically, in the preferred form of the method the steps of electrically isolating the wafer-supporting electrode and applying a bias voltage to it are performed prior to normal plasma processing within the chamber, to remove any particulates before an operation such as deposition is started.

The apparatus of the invention comprises a pair of generally parallel, first and second electrodes, the second one of which supports a semiconductor wafer for plasma processing; an isolation switch connected between the second electrode and ground; a high-frequency generator coupled between the upper electrode and ground, to provide power to initiate and sustain a plasma region between the first and second electrodes; a bias voltage generator providing sufficient voltage to launch any particulates on the wafer by electrostatic force; and a bias control switch connected between the bias voltage generator and the second electrode. Closing the bias control switch and opening the isolation switch results in application of the bias voltage to the lower electrode and launches particulates electrostatically from the wafer surface and into the plasma region, from which they may be later purged. The high-frequency generator maintains the plasma while the isolation switch is open, because of capacitive coupling from the second electrode to ground.

In the preferred form of the apparatus, the bias voltage generator generates an alternating voltage to ensure that both positively charged and negatively charged particulates will be launched from the wafer, and operates at a selected frequency between 60 Hz and approximately 13.56 MHz, and at a voltage in the range of 100 volts to 2,000 volts. The apparatus may also include a filter connected in series with the bias voltage generator, to protect it from damage from energy generated by the high-frequency generator used to initiate and maintain the plasma.

DESCRIPTION OF THE PREFERRED EMBODIMENT

Figure 1:
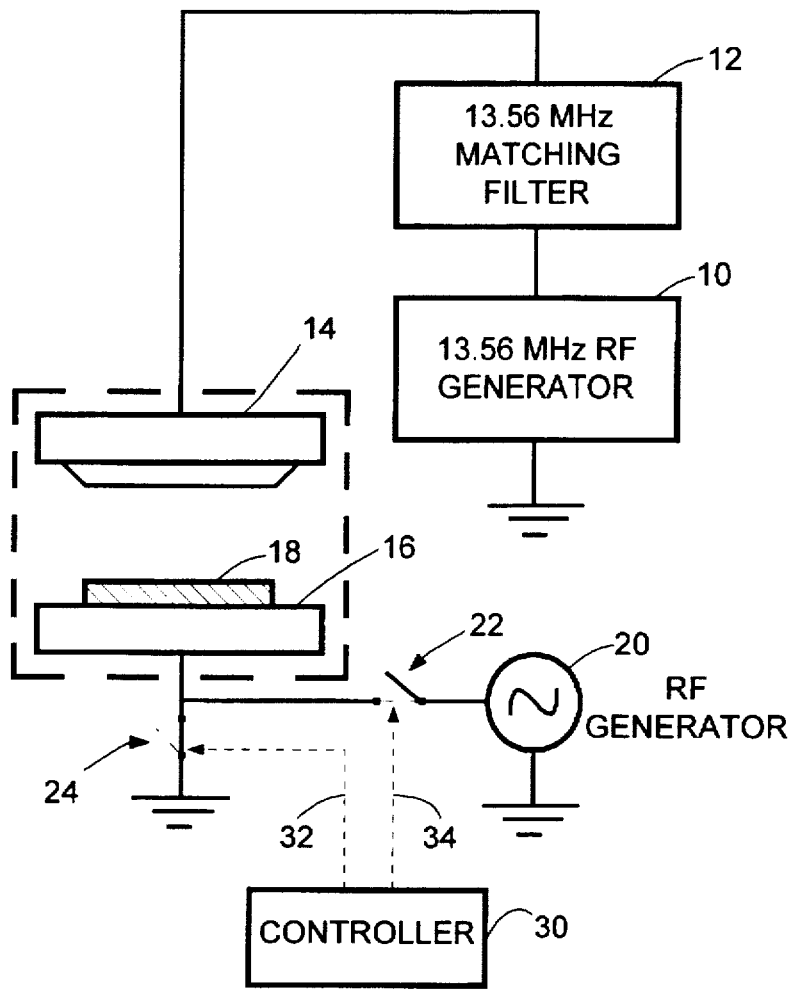
FIG. 1 is a simplified block diagram of the major components of a CVD processing chamber modified in accordance with the invention.

As shown in the drawing for purposes of illustration, the present invention pertains to an improved plasma processing chamber and method for its operation, wherein electrostatic forces are used to remove particulates from a semiconductor substrate in the processing chamber.

In a plasma enhanced chemical vapor deposition process, plasma gases are introduced into a vacuum chamber, and a plasma is initiated and maintained by means of radio-frequency (rf) energy coupled into the chamber. As shown in FIG. 1, for example, plasma energy is supplied from an rf generator 10, through an appropriate filter 12, and coupled to an upper electrode 14. A lower electrode in the form of a susceptor 16 supports a semiconductor wafer or substrate 18 and, in normal operation of the process chamber, is grounded.

In accordance with the invention, the apparatus further includes a separate rf generator 20 connected to the susceptor 16 through a switch 22. The susceptor 16, which is permanently grounded in conventional configurations, is in the present invention connected to ground through an isolation switch 24. The switches 22 and 24 are operated in unison by a controller 30, as indicated by control lines 32 and 34, such that only one of them is open at any time. When the isolator switch 24 is closed and the bias control switch 22 is open, the apparatus operates in the manner of a conventional PECVD system. However, when the isolator switch 24 is open and the bias control switch 22 is closed, the separate rf generator 20 generates sufficient electrostatic force at the wafer surface to launch particulates from the surface. Particles tend to be either positively or negatively charges, and the alternating electric field provided by the rf generator 20 launches both types of particles from the wafer surface. The particles become suspended in the sheath portion of the plasma generated by the rf generator 10. Particles suspended in the plasma can be later purged from the chamber by any of a variety of techniques involving flushing the chamber with inert or other gases without lowering the plasma energy supplied by the rf generator 10.

After launching the particles from the wafer 18, the conditions of the switches 22 and 24 are reversed by the controller 30 and the PECVD chamber begins normal operation again, and purging of the particles can be conveniently performed at the conclusion of normal processing. Because mobile charges in the plasma will move in such a way as to shield out the effect of the biased wafer surface, the bias can be applied only for a short time before the plasma adjusts to the presence of the bias. When the plasma has just been started, this time is a little longer than when the plasma has been in normal operation for some time.

The rf generator 20 has a frequency selected from between 60 Hz and 13.56 MHz or higher, and a voltage selected high enough to be in the same range as the potential of the plasma, i.e. typically in the ranges from 100 v to 2.000 v. While this bias voltage is being applied to the wafer 18, through the closed bias control switch 22, the plasma power must remain on so that the plasma will be maintained and any particles removed will become suspended in the plasma. Plasma rf power will continue to be coupled to ground capacitively, even though the susceptor 16 is electrically isolated. A filter (not shown) may be included in series with the bias rf generator 20 to protect it from high currents from the plasma energy source.

In a specific form of the method of the invention, the rf bias generator 20 is switched on before processing begins, after introduction of inert gas and initiation of the plasma. Thus any particulates residing on the surface of the wafer 18 will be launched and suspended in the plasma before actual processing (deposition) begins. At the end of processing, an appropriate purging step is used to remove the particulates from the chamber before turning off the plasma power. Failure to purge the particles prior to switching off the plasma would result in the suspended particles falling back onto the wafer surface. The controller 30 may also be used to control actuation of the rf generators 10 and 20.

It will be appreciated from the foregoing that the present invention represents a significant advance in the field of plasma processing. Specifically, the invention provides for removal of particulates from a wafer surface, either before or during deposition processing in a processing chamber. Although the preferred approach is to use an alternating (rf) bias source to launch both positively charged and negatively charged particles from the wafer surface, it will be understood that the invention could also be implemented using a direct-current (dc) bias source applied to the wafer to launch particles of a particular charge polarity. Moreover, other modifications may be made to the invention without departing from its spirit and scope. Accordingly, the invention should not be limited except as by the appended claims.

We claim:

1. A method for removing particulates from a semiconductor wafer surface in a plasma processing chamber, comprising the steps of:

applying high-frequency plasma power across a two electrodes, one of which is normally grounded and supports a semiconductor wafer to be processed, whereby the plasma power initiates and maintains a plasma between the electrodes;

at selected times, electrically isolating the wafer-supporting electrode and simultaneously applying to it a bias voltage selected to launch particulates from the surface of the wafer by electrostatic action; and maintaining the plasma during the selected times for launching the particulates, whereby, launched particulates are suspended in the plasma until they can be later removed.

2. A method as defined in claim 1, wherein the step of applying a bias voltage includes applying an alternating voltage, whereby both positively charged and negatively charged particulates will be launched from the semiconductor wafer.

3. A method as defined in claim 2, wherein the alternating bias voltage is selected to be in the same range as plasma potentials.

4. A method as defined in claim 3, wherein the alternating bias voltage is approximately 100 v to 2.000 v.

5. A method as defined in claim 1, wherein the steps of electrically isolating the wafer-supporting electrode and applying a bias voltage to it are performed prior to normal plasma processing within the chamber, to remove any particulates before deposition is started.

* * * * *